(12) United States Patent
Charlebois et al.

(10) Patent No.: US 10,006,964 B2
(45) Date of Patent: *Jun. 26, 2018

(54) CHIP PERFORMANCE MONITORING SYSTEM AND METHOD

(71) Applicant: International Business Machines Corporation, Armonk, NY (US)

(72) Inventors: Margaret R. Charlebois, Jericho, VT (US); Christopher D. Hanudel, Essex Junction, VT (US); Robert D. Herzl, South Burlington, VT (US); David W. Milton, Underhill, VT (US); Clarence R. Ogilvie, Huntington, VT (US); Paul M. Schanely, Essex Junction, VT (US); Tad J. Wilder, South Hero, VT (US)

(73) Assignee: International Business Machines Corporation, Armonk, NY (US)

( * ) Notice: Subject to any disclaimer, the term of this patent is extended or adjusted under 35 U.S.C. 154(b) by 1 day.

This patent is subject to a terminal disclaimer.

(21) Appl. No.: 15/134,781

(22) Filed: Apr. 21, 2016

(65) Prior Publication Data

US 2016/0231379 A1   Aug. 11, 2016

Related U.S. Application Data

(62) Division of application No. 13/737,168, filed on Jan. 9, 2013, now Pat. No. 9,383,766.

(51) Int. Cl.
*G01R 31/28* (2006.01)
*G01R 31/3177* (2006.01)
(Continued)

(52) U.S. Cl.
CPC ... *G01R 31/3177* (2013.01); *G01R 31/31727* (2013.01); *G01R 31/318577* (2013.01); *G06F 1/08* (2013.01); *G06F 11/348* (2013.01)

(58) Field of Classification Search
CPC .......... G01R 31/3177; G01R 31/31727; G01R 31/318577; G06F 1/08; G06F 11/348
See application file for complete search history.

(56) References Cited

U.S. PATENT DOCUMENTS

| 3,696,298 A | 10/1972 | Kahn et al. |
| 5,063,445 A | 11/1991 | Nishizawa et al. |
(Continued)

FOREIGN PATENT DOCUMENTS

| JP | 59-181548 A | 10/1984 |
| JP | 08-15389 A | 1/1996 |

OTHER PUBLICATIONS

Mason, et al., "Analog DFT Using an Undersampling Technique," Analog DFT, IEEE Design & Test of Computers, 1999, pp. 84-88.
(Continued)

*Primary Examiner* — Christine T. Tu
(74) *Attorney, Agent, or Firm* — Gibb & Riley, LLC; Steven J. Meyers, Esq.

(57) ABSTRACT

Disclosed are a chip performance monitoring system, method and a computer program product, wherein a performance monitor output signal is propagated through an adjacent scan chain to avoid signal degradation incident to across-chip transmission of high frequency signals. Since the clock signal frequency used to control signal propagation through the scan chain will typically be less than twice the performance monitor output signal frequency, frequency sub-sampling with aliasing occurs. To compensate, signal propagation through the scan chain can be controlled during different time periods using different clock signals having different clock signal frequencies and, during these different time periods, different data outputs can be captured at an output node of the scan chain. The data output frequencies of these different data outputs can be measured and the performance monitor output signal frequency can be determined
(Continued)

mined based on the different data output frequencies given the different clock signal frequencies.

20 Claims, 5 Drawing Sheets

(51) Int. Cl.
  *G06F 1/08* (2006.01)
  *G06F 11/34* (2006.01)
  *G01R 31/3185* (2006.01)
  *G01R 31/317* (2006.01)

(56) References Cited

U.S. PATENT DOCUMENTS

| | | | |
|---|---|---|---|
| 6,784,812 B2 | 8/2004 | Craven et al. | |
| 7,233,163 B2 | 6/2007 | Krishnamoorthy et al. | |
| 7,675,312 B2 | 3/2010 | Ho et al. | |
| 7,765,445 B2 | 7/2010 | Eckelman et al. | |
| 7,778,371 B2 * | 8/2010 | Do | 327/115 |
| 8,154,309 B2 | 4/2012 | Agarwal et al. | |
| 9,097,765 B1 | 8/2015 | Charlebois et al. | |
| 9,128,151 B1 | 9/2015 | Charlebois et al. | |
| 9,188,643 B2 | 11/2015 | Charlebois et al. | |
| 9,383,766 B2 * | 7/2016 | Charlebois | G06F 1/08 |
| 2002/0129293 A1 | 9/2002 | Hutton et al. | |
| 2003/0046623 A1 * | 3/2003 | Khoche | G01B 31/318572 |
| | | | 714/726 |
| 2010/0321042 A1 | 12/2010 | Agarwal et al. | |
| 2011/0006794 A1 | 1/2011 | Sellathamby et al. | |
| 2012/0246528 A1 | 9/2012 | Pugliesi-Conti | |

OTHER PUBLICATIONS

Pham, et al., "Functional Test and Speed/Power Sorting of the IBM POWER6 and Z10 Processors," IEEE International Test Conference, Paper 18.1, 2008, pp. 1-7.

U.S. Appl. No. 13/737,168, Office Action Communication dated Dec. 3, 2015, 8 pages.

U.S. Appl. No. 13/737,168, Office Action Communication dated Dec. 31, 2015, 36 pages.

U.S. Appl. No. 13/737,168, Notice of Allowance dated Apr. 4, 2016, 7 pages.

* cited by examiner

CHIP PERFORMANCE MONITORING SYSTEM AND METHOD

CROSS-REFERENCE TO RELATED APPLICATIONS

The present invention claims the benefit under 35 U.S.C. § 120 as a divisional of U.S. patent application Ser. No. 13/737,168 filed on Jan. 9, 2013, now U.S. Pat. No. 9,383,766, issued Jul. 5, 2016, the entire teachings of which are incorporated herein by reference.

BACKGROUND

The embodiments disclosed herein relate to chip performance monitoring and, more particularly, to a chip performance monitoring system, which incorporates the use of scan chains to sample high frequency performance monitor output signals, as well as an associated chip performance monitoring method and computer program product.

DESCRIPTION OF THE RELATED ART

On-chip fine-grained performance monitors, such as performance screen ring oscillators (PSROs), are increasingly being used to detect across-chip process variations. Specifically, large numbers of performance monitors are positioned at various different locations across an integrated circuit chip. These performance monitors produce output signals that can be transmitted, using relatively long wires, across the integrated circuit chip to either an on-chip processor or to an output pin for connection to an off-chip processor for further processing in order to detect across-chip performance variations. Ideally, small performance monitors with minimal support infrastructure should be used so that a minimal amount of chip area is consumed. Unfortunately, small PSROs typically produce relatively high frequency output signals and, when such high frequency output signals are transmitted along relatively long wires, signal degradation often occurs, thereby limiting the accuracy of any conclusions made based on those output signals.

SUMMARY

In view of the foregoing disclosed herein are embodiments of a chip performance monitoring system, a chip performance monitoring method and a computer program product, wherein a high frequency performance monitor output signal from an on-chip performance monitor is propagated through an adjacent scan chain, which is otherwise used for scan chain testing of combinational logic, to avoid signal degradation incident to across-chip transmission of high frequency signals. In these embodiments, since the clock signal frequency used to control signal propagation through the scan chain will typically be less than twice the performance monitor output signal frequency, frequency sub-sampling with aliasing may occur. To compensate, signal propagation through the scan chain can be controlled during different time periods using different clock signals having different clock signal frequencies and, during these different time periods, different data outputs can be captured at an output node of the scan chain. The data output frequencies of these different data outputs can be measured and the performance monitor output signal frequency can be determined based on the different data output frequencies given the different clock signal frequencies (i.e., given the frequencies of the different clock signals used to control the timing of signal propagation through the scan chain and, thereby resulting in the different data outputs with the different data output frequencies).

More particularly, disclosed herein are embodiments of a chip performance monitoring system. Specifically, the chip performance monitoring system can comprise an integrated circuit chip and, on the integrated circuit chip, a performance monitor, a scan chain, a multiplexer electrically connected between the performance monitor and an input node of the scan chain (e.g., to an input node connected to a first multiplexed flip-flop in the scan chain or to an input node connected to any other multiplexed flip-flop in the scan chain). The performance monitor can output a performance monitor output signal having a performance monitor output signal frequency that is relatively high. When the scan chain is to be operated in a performance monitor test mode, the multiplexer can selectively apply the performance monitor output signal to the input node and the scan chain can propagate the performance monitor output signal. The chip performance monitoring system can further comprise a processor that captures the data output at an output node of the scan chain, determines the frequency of the data output and, based on the frequency of the data output, determines the performance monitor output signal frequency. Thus, the scan chain can be used to avoid signal degradation incident to across-chip transmission of the relatively high performance monitor output signal frequency.

However, since the clock signal frequency used to control signal propagation through the scan chain will typically be less than twice the performance monitor output signal frequency, frequency sub-sampling with aliasing occurs. In order to compensate for this aliasing, embodiments of the chip performance monitoring system can further comprise a variable clock signal generator on the integrated circuit chip and operatively connected to the scan chain. As discussed above, the performance monitor can output a performance monitor output signal having a performance monitor output signal frequency. When the scan chain is to be operated in a performance monitor test mode, the multiplexer can selectively apply the performance monitor output signal to the input node and the scan chain can propagate the performance monitor output signal. The variable clock signal generator can generate different clock signals having different clock signal frequencies (also referred to herein as different sampling frequencies) for controlling signal propagation timing through the scan chain within different time periods such that, during the different time periods, different data outputs with different data output frequencies are output at an output node of the scan chain (e.g., an output node connected to an intermediate multiplexed flip-flop in the scan chain downstream of the input node or to a last multiplexed flip-flop in the scan chain). Finally, this chip performance monitoring system can further comprise a processor electrically connected to the output node (e.g., either directly in the case of an on-chip processor or through an output pin in the case of an off-chip processor). This processor can determine the different data output frequencies of the different data outputs at the output node during the different time periods and can then determine the performance monitor output signal frequency based on the different data output frequencies given the different clock signal frequencies (i.e., given the frequencies of the different clock signals used to control the timing of signal propagation through the scan chain and, thereby resulting in the different data outputs with the different data output frequencies).

Also disclosed herein are embodiments of a chip performance monitoring method. The method can comprise receiving, by a processor, different data outputs captured at an output node of a scan chain on an integrated circuit chip at different time periods during propagation of a performance monitor output signal through the scan chain, where the different time periods correspond to when timing of signal propagation through the scan chain is controlled by different clock signals having different clock signal frequencies. The method can further comprise determining, by the processor, the different data output frequencies of the different data outputs and further determining the performance monitor output signal frequency based on the different data output frequencies given the different clock signal frequencies (i.e., given the frequencies of the different clock signals used to control the timing of signal propagation through the scan chain and, thereby resulting in the different data outputs with the different data output frequencies).

Also disclosed herein are embodiments of a computer program product. The computer program product can comprise a tangible computer readable storage device. The tangible computer readable storage device can store program code, which is executable by a computer to perform the above-described chip performance monitoring method.

BRIEF DESCRIPTION OF THE DRAWINGS

The embodiments herein will be better understood from the following detailed description with reference to the drawings, which are not necessarily drawn to scale and in which.

DETAILED DESCRIPTION

As mentioned above, on-chip fine-grained performance monitors, such as performance screen ring oscillators (PSROs), are increasingly being used to detect across-chip process variations. Specifically, large numbers of performance monitors are positioned at various different locations across an integrated circuit chip. These performance monitors produce output signals that can be transmitted, using relatively long wires, across the integrated circuit chip to either an on-chip processor or to an output pin for connection to an off-chip processor for further processing in order to detect across-chip performance variations. Ideally, small performance monitors with minimal support infrastructure should be used so that a minimal amount of chip area is consumed. Unfortunately, small PSROs typically produce relatively high frequency output signals and, when such high frequency output signals are transmitted along relatively long wires, signal degradation often occurs, thereby limiting the accuracy of any conclusions made based on those output signals.

In view of the foregoing disclosed herein are embodiments of a chip performance monitoring system, a chip performance monitoring method and a computer program product, wherein a high frequency performance monitor output signal from an on-chip performance monitor is propagated through an adjacent scan chain, which is otherwise used for scan chain testing of combinational logic, to avoid signal degradation incident to across-chip transmission of high frequency signals. In these embodiments, since the clock signal frequency used to control signal propagation through the scan chain will typically be less than twice the performance monitor output signal frequency, frequency sub-sampling with aliasing may occur. To compensate, signal propagation through the scan chain can be controlled during different time periods using different clock signals having different clock signal frequencies and, during these different time periods, different data outputs can be captured at an output node of the scan chain. The data output frequencies of these different data outputs can be measured and the performance monitor output signal frequency can be determined based on the different data output frequencies given the different clock signal frequencies (i.e., given the frequencies of the different clock signals used to control the timing of signal propagation through the scan chain and, thereby resulting in the different data outputs with the different data output frequencies).

Figure 1:
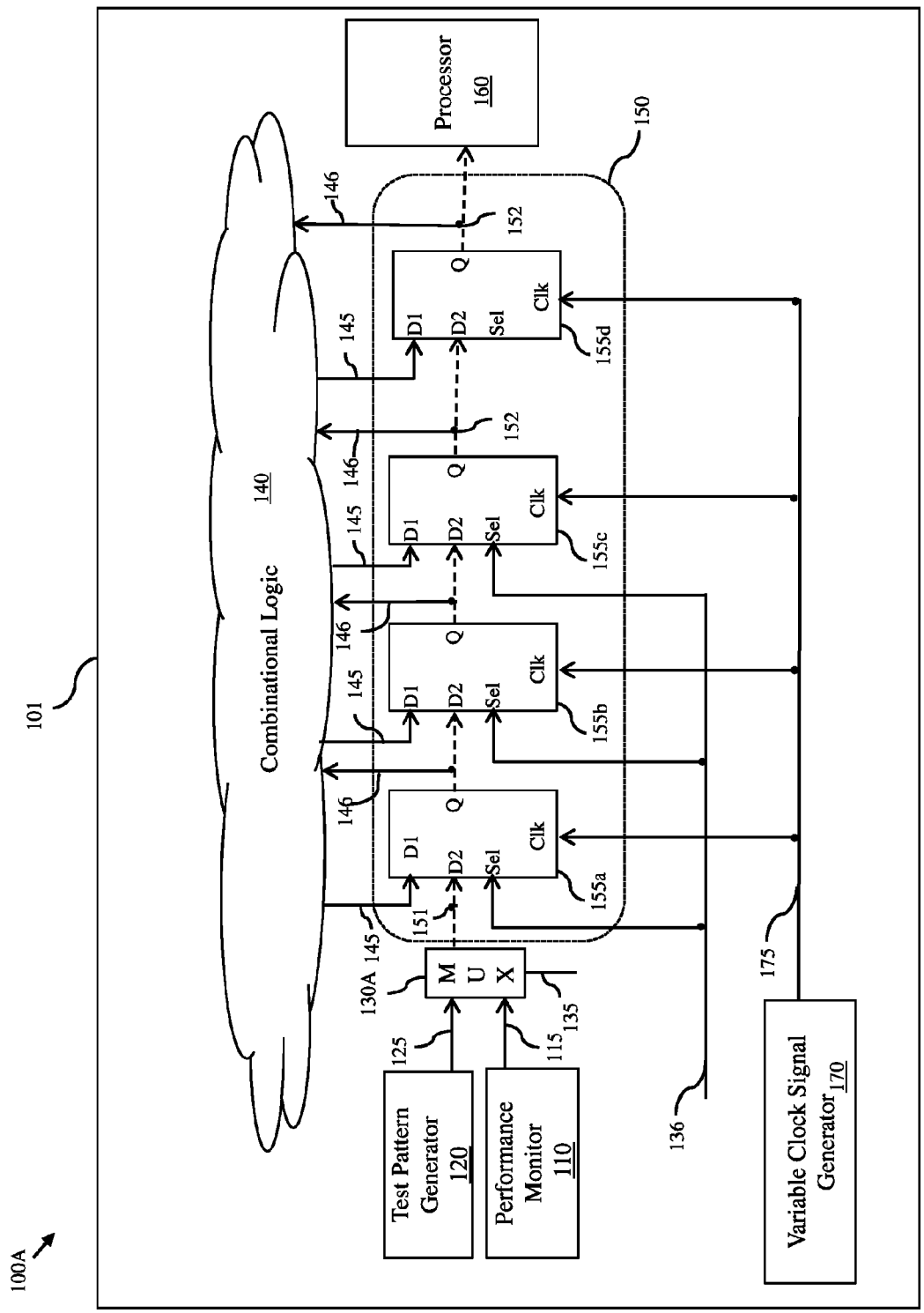
FIG. 1 is a schematic diagram illustrating an embodiment of a chip performance monitoring system.
Figure 2:
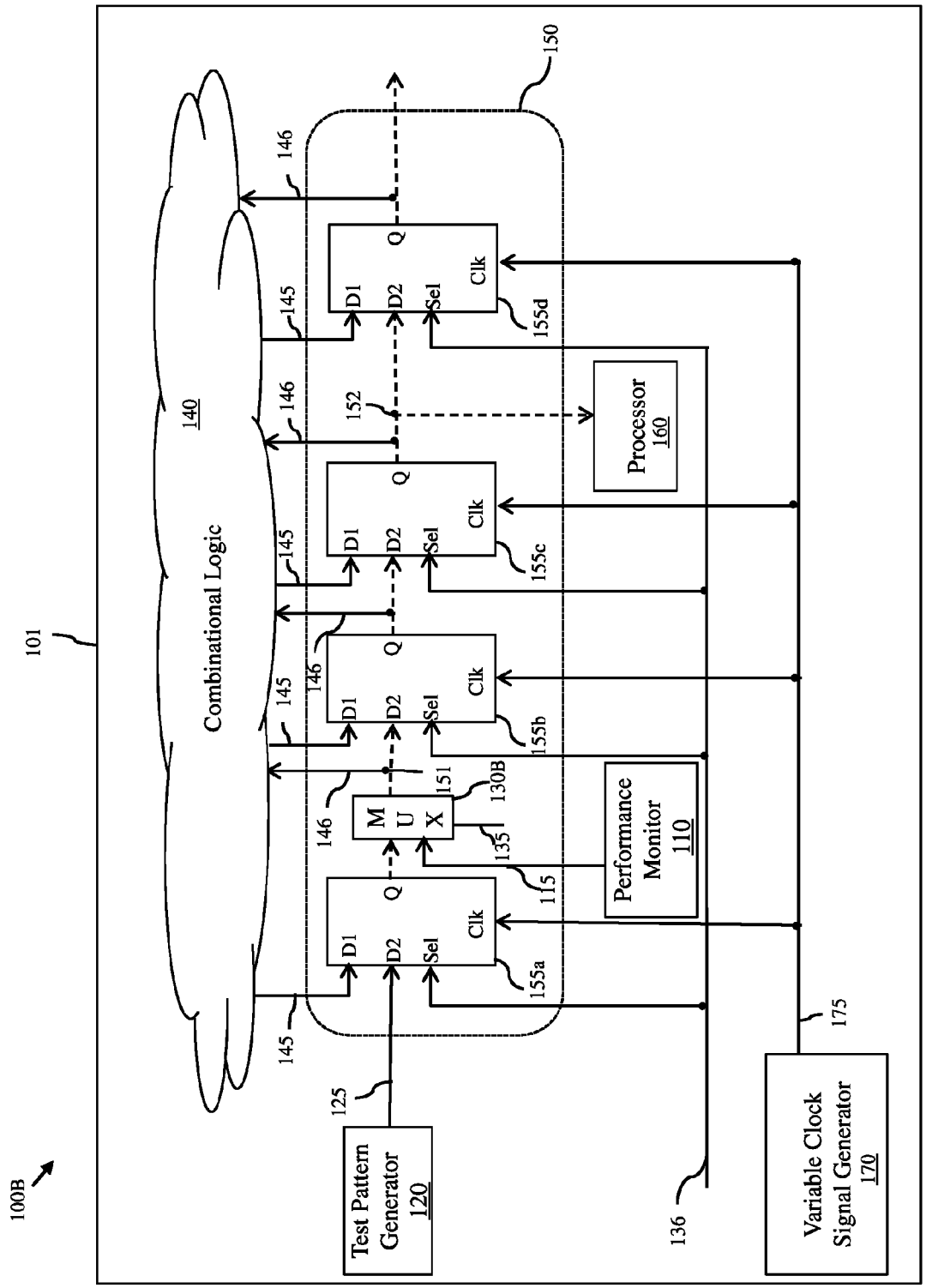
FIG. 2 is a schematic diagram illustrating another embodiment of a chip performance monitoring system.

More particularly, referring to FIGS. 1 and 2 disclosed herein are embodiments 100A and 100B, respectively, of a chip performance monitoring system. In these embodiments 100A and 100B, the chip performance monitoring system can comprise an integrated circuit chip 101. A performance monitor 110 and, preferably, multiple performance monitors 110 can be positioned at various locations across the integrated circuit chip 101. Each performance monitor 110 can output (i.e., can be adapted to output, can be configured to output, etc.) a performance monitor output signal 115 having a performance monitor output signal frequency.

In these embodiments 100A and 100B, the chip performance monitoring system can further comprise a processor 160 (e.g., either an on-chip processor 160, as shown, or an off-chip processor, not shown). The processor 160 can determine (i.e., can be adapted to determine, can be configured to determine, can be programmed to determine, etc.) the quality of the performance of a circuit under test based on the frequency of the performance monitor output signal(s) 115 from the performance monitor(s) 110.

For example, each performance monitor 110 can comprise a performance screen ring oscillator (PSRO). A PSRO is an on-chip structure typically comprising a ring of free-running, series-connected devices. Various different PSRO structures are well known in the art and, thus, the details are omitted from this specification in order to allow the reader to focus on the salient aspects of the disclosed embodiments. In any case, the processor 160 can determine the speed of a circuit under test based on the oscillation frequency of the PSRO output signal 115 (i.e., the PSRO output signal frequency) and, thereby can determine whether the circuit under test meets performance specifications. Additionally, by comparing PSRO output signal frequencies from multiple PSROs, the processor 160 can identify across-chip process variations.

However, as mentioned above, the output signal of a small PSRO typically has a relatively high oscillation frequency (e.g., of 1-5 GHz) and, when such a high frequency output signal is transmitted on a relatively long wire across-chip to a processor 160 (e.g., to either an on-chip processor, as shown, or to an output pin for connection to an off-chip processor), signal degradation can occur, thereby limiting the accuracy of any conclusions made by the processor 160 based on the frequency of that output signal. Consequently, the embodiments 100A and 100B of the chip performance monitoring system disclosed herein use a scan chain 150 associated with on-chip functional combinational logic 140 to propagate the performance monitor output signal 115 in order to avoid signal degradation incident to across-chip transmission of any performance monitor output signal 115 having a relatively high frequency.

Specifically, in the embodiments 100A and 100B of the chip performance monitoring system disclosed herein, the integrated circuit chip 101 can further comprise functional combinational logic 140 that incorporates one or more scan chains 150. Those skilled in the art will recognize that scan chains 150 are typically incorporated into functional combinational logic 140 to enhance testability and diagnosability.

For example, each scan chain 150 can comprise a plurality of multiplexed flip-flops 155a-155d (also referred to herein as one-bit register elements) connected in series. During a normal operation mode (e.g., when a test select signal 136 is low), each of these multiplexed flip-flops 155a-d can operate by receiving operational data input 145 at a first input D1 from components of the combinational logic 140 and by outputting operational data output 146 at an output Q back to components of the combinational logic 140. However, as mentioned above, these multiplexed flip-flops 155a-d can also be connected in series.

During a test mode (e.g., when the test select signal 136 is high), any inputs applied to a second input D2 on the first multiplexed flip-flop 155a in the scan chain 150 will be received, propagated out the output node Q of the first multiplexed flip-flop 155a and into the second input D2 and out the output Q of each of the additional flip-flops 155b-155d in the scan chain 150 in sequence (as indicated by the dotted arrows). Timing of signal propagation through the flip-flops 155a-d in the scan chain 150 during the test mode can be controlled by a clock signal 175 from a clock signal generator 170. Configured in this manner, the scan chain 150 can be used to test for various different types of faults in the flip-flops 155a-d. For example, to test for stuck-at faults, scan data input 125, which comprises a particular test pattern from a test pattern generator 120, can be applied to the input D2 of the first multiplexed flip-flop 155a and propagated through the scan chain 150. Subsequently, scan data output can be captured by a processor 160 at the output Q of the last multiplexed flip-flop 155d in the scan chain and analyzed to determine whether the particular test pattern reappears. A variation in the test pattern between what is applied at the beginning of the scan chain 150 and what appears at the end of the scan chain 150 can be indicative of a stuck-at fault.

It should be noted that, for purposes of illustration, the functional combinational logic 140 is shown in FIGS. 1 and 2 as incorporating a single scan chain 150 comprising four multiplexed flip-flops 155a-155d connected in series. However, this functional combinational logic 140 can, alternatively, incorporate multiple scan chains 150. Furthermore, each scan chain 150 can, alternatively, comprise any number of two or more multiplexed flip-flops and/or other types of register elements configured in any other suitable manner for scan chain operation. That is, various different scan chain configurations are well known in the art and can, alternatively, be incorporated into the chip performance monitoring system 100 disclosed herein.

In any case, this same scan chain 150, when operating in the test mode (e.g., when the test select signal 136 is high), can alternatively be used to propagate the performance monitor output signal 115 in order to avoid signal degradation incident to across-chip transmission of a high frequency signal to the processor 160.

To accomplish this, the embodiments of the chip performance monitoring system can further comprise a multiplexer that selectively controls the input signal applied to an input node 151 connected the input D2 of any one of the multiplexed flip-flops 155a-d in the scan chain 150.

For example, in one embodiment as illustrated in FIG. 1, the chip performance monitoring system 100A can further comprise a multiplexer 130A that selectively controls which signal is applied to an input node 151 that is connected to the input D2 of the first multiplexed flip-flop 155a in the scan chain 150, during the test mode. Specifically, this multiplexer 130A can receive (i.e., can be adapted to receive, can be configured to receive, etc.) both the scan data input 125 from the test pattern generator 120 and the performance monitor output signal 115 from the performance monitor 110. Then, depending upon whether a performance monitor select signal 135 received by the multiplexer 130A is low or high, and thereby indicative of the type of test mode (e.g., a fault test mode or a performance monitor test mode), the multiplexer 130A can selectively transmit either the scan data input 125 from the test pattern generator 120 or the performance monitor output signal 115 from the performance monitor 110 to the input node 151 and, thereby to the input D2 of the first multiplexed flip-flop 155a in the scan chain 150. Specifically, when in the fault test mode (e.g., when the test select signal 136 is high and the performance monitor select signal 135 to the multiplexer 130A is low), the multiplexer 130A can selectively transmit (i.e., can be adapted to selectively transmit, can be configured to selectively transmit, etc.) scan data input 125 (i.e., a particular test pattern) from the test pattern generator 120 to the input node 151 and, thereby to the input D2 of the first multiplexed flip-flop 155a in the scan chain 150 so as to allow a fault test to be performed, as discussed in detail above. However, when in the performance monitor test mode (e.g., when the test select signal 136 is high and the performance monitor select signal 135 to the multiplexer 130A is also high), the multiplexer 130A can selectively transmit (i.e., can be adapted to selectively transmit, can be configured to selectively transmit, etc.) the performance monitor output signal 115 to the input node 151 connected to the input D2 of the first multiplexed flip-flop 155a of the scan chain 150 so that a performance monitor test can be performed.

Alternatively, as illustrated in FIG. 2, the chip performance monitoring system 100B can further comprise a multiplexer 130B that selectively controls which signal is applied to an input node 151 that is connected to the input D2 of any intermediate multiplexed flip-flop in the scan chain 150 (e.g., multiplexed flip-flop 155b, as shown) or even the last multiplexed flip-flop in the scan chain 150 in the scan chain 150, during the test mode. Specifically, this multiplexer 130B can be inserted between any two of the multiplexed flip-flops in the scan chain 150. The multiplexer 130B can receive scan data input 125 (i.e., a particular test pattern), which has been generated by the test pattern generator 120 and propagated through one or more upstream multiplexed flip flops in the scan chain 150 (e.g., through the first multiplexed flip-flop 155a, as shown) to an output Q of the multiplexed flip-flop immediately perceiving the multiplexer 130B. The multiplexer 130B can also receive the performance monitor output signal 115 from the performance monitor 110. Then, depending upon whether a performance monitor select signal 135 received by the multiplexer 130B is low or high, and thereby indicative of the type of test mode (e.g., a fault test mode or a performance monitor test mode), the multiplexer 130B can selectively transmit either the scan data input 125 (i.e., the particular test pattern) from the output Q or the performance monitor output signal 115 from the performance monitor 110 to the input node 151 and, thereby to the input D2 of the next multiplexed flip-flop (e.g., multiplexed flip-flop 155b, as shown) in the scan chain 150. Specifically, when in the fault test mode (e.g., when the test select signal 136 is high and the performance monitor select signal 135 to the multiplexer 130B is low), the multiplexer 130B can selectively transmit (i.e., can be adapted to selectively transmit, can be configured to selectively transmit, etc.) scan data input 125 (i.e., the particular test pattern) to the input node 151 and, thereby to the input D2 of the next multiplexed flip-flop (e.g., multiplexed flip-flop 155b, as shown) in the scan chain 150 so as to allow a fault test to continue to be performed, as discussed in detail above. However, when in the performance monitor test mode (e.g., when the test select signal 136 is high and the performance monitor select signal 135 to the multiplexer 130B is also high), the multiplexer 130B can selectively transmit (i.e., can be adapted to selectively transmit, can be configured to selectively transmit, etc.) the performance monitor output signal 115 to the input node 151 and, thereby to the input D2 of the next multiplexed flip-flop (e.g., multiplexed flip-flop 155b, as shown) in the scan chain 150 so that a performance monitor test can be performed.

In any case, during the performance monitor test, the performance monitor output signal 115 will be received at the input D2 of a multiplexed flip-flop in the scan chain 150 and propagated in sequence through at least that one multiplexed flip-flop to an output node 152 for connection to the processor 160. Thus, this output node 152 can be electrically connected to the output Q of the very last multiplexed flip-flop 155d in the scan chain 150, as shown in FIG. 1, regardless of the positioning of the multiplexer and input node (e.g., before the first multiplexed flip-flop 155a, as shown in FIG. 1, or between two multiplexed flip-flops 155a and 155b, as illustrated in FIG. 2). Furthermore, this output node 152 can be a tap off the output Q of any intermediate multiplexed flip-flop that is in the scan chain 150 as long as it is downstream of the input node 151. For example, if, as illustrated in FIG. 1, the multiplexer 130A is before the first multiplexed flip-flop 155a, then the output node 152 can be connected to the output Q of any of the multiplexed flip-flops 155a-d. However, if, as illustrated in FIG. 2, the multiplexer 130B is inserted between the multiplexed flip-flops 155a and 155b, then the output node 152 can be connected to the output Q of any one of multiplexed flip-flops 155b-d (e.g., see output node 152 connected to the output Q of the multiplexed flip-flop 155c)

The processor 160 can be electrically connected to the output node 152 (e.g., directly connected in the case of an on-chip processor, as shown, or connected via an output pin, not shown). During the performance monitor test mode, the processor 160 can capture (i.e., can be adapted to capture, can be configured to capture, etc.) the performance monitor data output at the output node 152 and can determine (i.e., can be adapted to determine, can be configured to determine, etc.) and, more particularly, can count the frequency of the performance monitor data output. Then, based on the performance monitor data output frequency, the processor 160 can determine (i.e., can be adapted to determine can be configured to determine, can be programmed to determine, etc.) the performance monitor output signal frequency.

As mentioned above, timing of signal propagation through the multiplexed flip-flops in the scan chain 150 will be controlled by the clock signal 175 from the clock signal generator 170. However, those skilled in the art will recognize that scan chain timing is typically controlled by a relatively slow clock signal (i.e., clock signal having a clock signal frequency that is, for example, 30-60 MHz). Specifically, the frequency of the clock signal 175 (i.e., the clock signal frequency, also referred to herein as the sampling frequency) will typically be less than twice the frequency of the performance monitor output signal 115. Thus, the technique of propagating the performance monitor output signal 115 through one or all of the multiplexed flip-flops 155a-d in a scan chain 150 violates the Nyquist criterion, is referred to as sub-sampling and aliasing occurs such that the relationship between the performance monitor output signal frequency and the data output frequency is not linear. Instead there is a triangular relationship between the performance monitor output signal frequency of the performance monitor output signal 115 applied to the input node 151, the data output frequency of the data output at the output node 152 and the clock signal frequency (i.e., the sampling frequency) used to control signal propagation between the input node 151 and output node 152, thereby making determination of the performance monitor output frequency difficult.

One technique that can be used to compensate for this aliasing and to determine the performance monitor output signal frequency taking into consideration this triangular relationship, involves acquiring different data output frequencies of different data outputs resulting from the propagation of the performance monitor output signal 115 through the scan chain 150 using multiple different clock signals having multiple different clock signal frequencies (i.e., multiple sampling frequencies). Specifically, in the embodiments 100A and 100B disclosed herein, the clock signal generator 170 can comprise a variable clock signal generator. This variable clock signal generator 170 can generate (i.e., can be adapted to generate, can be configured to generate, etc.) different clock signals 175 having different clock signal frequencies and, particularly, at least two different clock signals with two different clock signal frequencies. Variable clock signal generators are well known in the art and, thus, the details of such variable clock signal generators are omitted from this specification in order to allow the reader to focus on the salient aspects of the disclosed embodiments.

In any case, the variable clock signal generator 170 can generate the different clock signals 175 having the different clock signal frequencies (i.e., different sampling frequencies) for controlling signal propagation timing through the scan chain 150 within different time periods such that, during these different time periods, different data outputs with different data output frequencies can be captured at the output node 152. The different clock signal frequencies (i.e., different sampling frequencies) will each typically be less than twice the performance monitor output signal frequency and, thus, sampling using any of one of these different clock signals alone would violate the Nyquist criterion. However, if used in combination, aliasing can be overcome. Specifically, the processor 160 can determine the different data output frequencies of the different data outputs during the different time periods and can determine the performance monitor output signal frequency based the different data output frequencies given the different clock signal frequencies (i.e., given the frequencies of the different clock signals used to control the timing of signal propagation through the scan chain 150 and, thereby resulting in the different data outputs with the different data output frequencies at the output node 152).

For example, the processor 160 can determine the performance monitor output signal frequency using the following triangular frequency expression:

$$f_o = ABS(f_h - (ROUND(f_h/f_s, 0) * f_s)), \quad (1)$$

where $f_o$ is the data output frequency, $f_h$ is the performance monitor output frequency, and $f_s$ is the corresponding clock signal frequency. Additionally, this triangular frequency expression (1) can be solved for as a piecewise function described by any of the following additional frequency expressions:

$$f_h = n * f_s - f_o \quad (2)$$

or $$f_h = n * f_s + f_o. \quad (3)$$

where n is a sequential set of integers such that $f_h$ is a bounded range of possible $f_h$ values.

Figure 3:
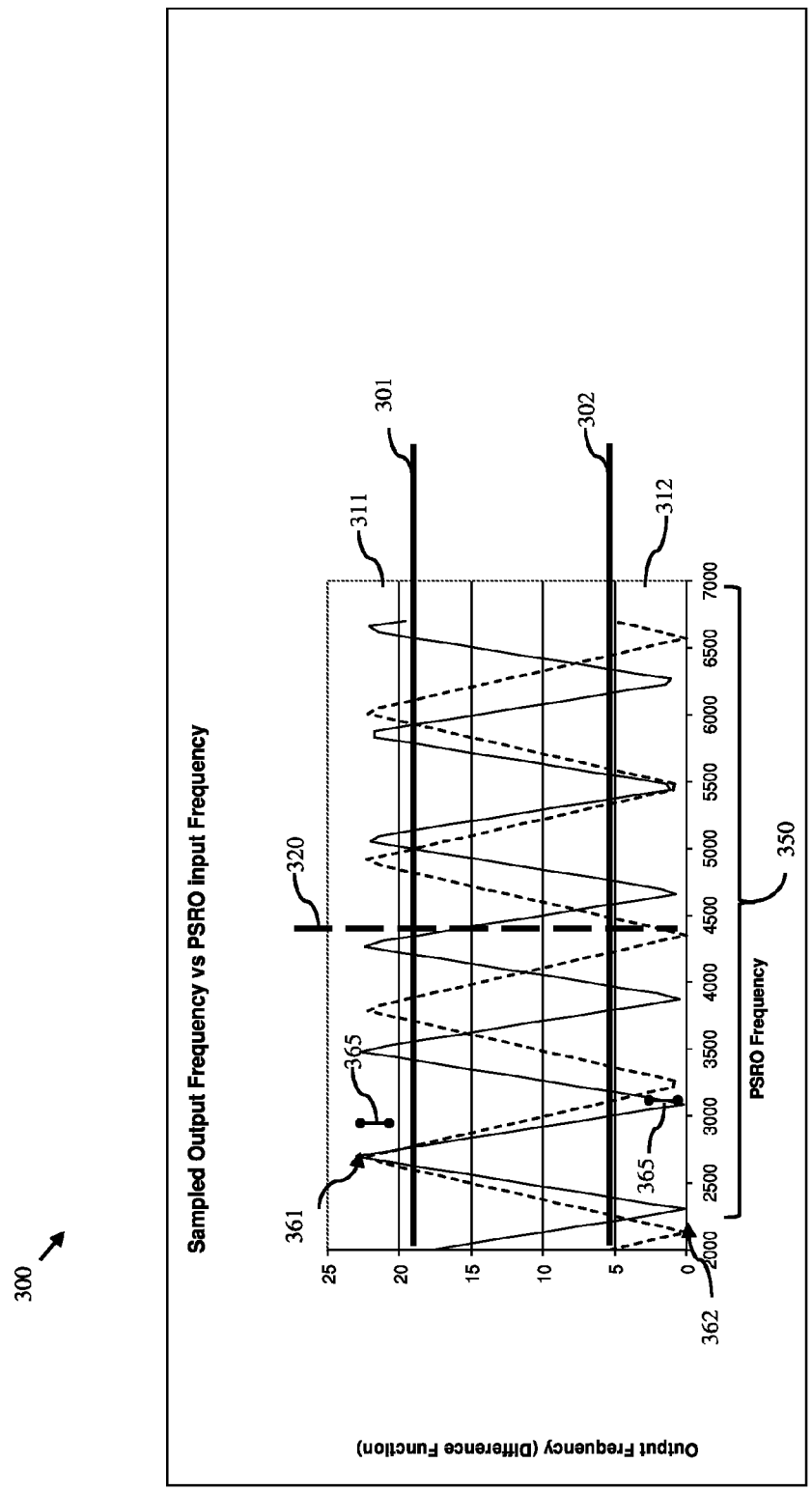
FIG. 3 is a graph illustrating an exemplary plotting technique that can be used to determine performance monitor output signal frequency.

In light of these frequency expressions (1)-(3) and referring to the graph of FIG. 3 in combination with FIG. 1, in one embodiment, the processor 160 can perform (i.e., can be adapted to perform, can be configured to perform, can be programmed to perform, etc.) the following graph plotting and analysis steps in order to determine the performance monitor output signal frequency based on the different data output frequencies given the different clock signal frequencies (i.e., the different sampling frequencies) of the clock signals used to control the timing of signal propagation through the scan chain 150. Specifically, a first horizontal line 301 and a second horizontal line 302 can be plotted on the frequency graph of FIG. 3. The first horizontal line 301 can represent a first data output frequency (e.g., of 19.8) of a first data output captured at the scan chain output node 152 during a first time period and associated with sub-sampling using a first clock signal having a first clock frequency (e.g., 46.1 MHz) that assumed to be less than twice the performance monitor output signal frequency. Similarly, the second horizontal line 302 can represent a second data output frequency (e.g., of 5.35) of a second data output captured at the scan chain output node 152 during a second time period and associated with sub-sampling using a second clock signal having a second clock signal frequency (e.g., 45.333 MHz) that assumed to be less than twice the performance monitor output signal frequency. Additionally, a first triangular wave 311 and a second triangular wave 312 can be plotted on the graph 300. The expressions (2) and (3) described above can be used to graph the different angled segments of these triangular waves 311 and 312 such that the first triangular wave 311 represents all first possible performance monitor output signal frequency values given the first clock signal frequency and the first data output frequency and such that the second triangular wave 312 represents all second possible performance monitor output signal frequency values given the second clock signal frequency and the second data output frequency. This graph 300 and, particularly, the first and second horizontal data output frequency lines 301 and 302 and the triangular waves 311 and 312 representing possible performance monitor output signal frequencies can then be analyzed to identify a common frequency (e.g., of 4221.4 MHz, as indicated by the vertical line 320) where the first triangular wave 311 intersects the first horizontal line 301 and the second triangular wave 312 intersects the second horizontal line 302. This common frequency 320 will be the performance monitor output signal frequency, as long as the common frequency is not equal to zero.

In this embodiment, to ensure that only one common frequency is identified as the performance monitor output signal frequency, the different clock signal frequencies (i.e., the first clock signal frequency and the second clock signal frequency) should be pre-selected so that a pattern created by overlaying the first horizontal line 301, the second horizontal line 302, the first triangular wave 311 and the second triangular wave 312 within the graph is non-repeating within a given range 350 of all possible performance monitor output signals, as shown in FIG. 3. As long as the two different clock signal frequencies (i.e., the two different sampling frequencies) are preselected such that they are sufficiently close to each other, it can be assured that triangular waves 311 and 312 are not repeating over the frequency range 350 of interest for the performance monitor so that only one possible answer frequency (i.e., one possible common frequency 320) is found. Additionally, in this embodiment, to ensure that the first and second horizontal lines 301 and 302 representing the first and second data output frequencies, respectively, do not fall on the outer boundaries of the possible performance monitor output signal frequencies (i.e., on the peaks of the first and second triangular waves, respectively) where frequency jitter can cause inaccurate results, the different clock signal frequencies (i.e., the first clock signal frequency and the second clock signal frequency) can further be pre-selected such that the first data output frequency (i.e., the first horizontal line 301) and the second data output frequency (i.e., the second horizontal line 302) will fall between and, more particularly, at least some minimum frequency difference 365 from the high and low peaks 361-362 of the first triangular wave 311 and the second triangular wave 312, as shown in FIG. 3.

It should be understood that, alternatively, any other suitable technique can be used by the processor 160 to determine the performance monitor output signal frequency following propagation of the performance monitor output signal 115 through a scan chain 150 or portion thereof, as discussed above.

Once the processor 160 has determined the performance monitor output signal frequency (e.g., the PSRO frequency), it can further determine the speed of a circuit under test based on that output signal frequency and can, thereby determine whether the circuit under test meets performance specifications. Additionally, by comparing performance monitor output signal frequencies (e.g., PSRO output signal frequencies) from multiple PSROs, the processor 160 can identify across-chip process variations. Techniques for determining whether a circuit under test meets performance specifications based on a performance monitor output signal frequency and/or identifying across-chip process variations based on a comparison of multiple performance monitor output signal frequencies are well known in the art and, thus, the details of such techniques are omitted from this specification in order to allow the reader to focus on the salient aspects of the disclosed embodiments.

Figure 4:
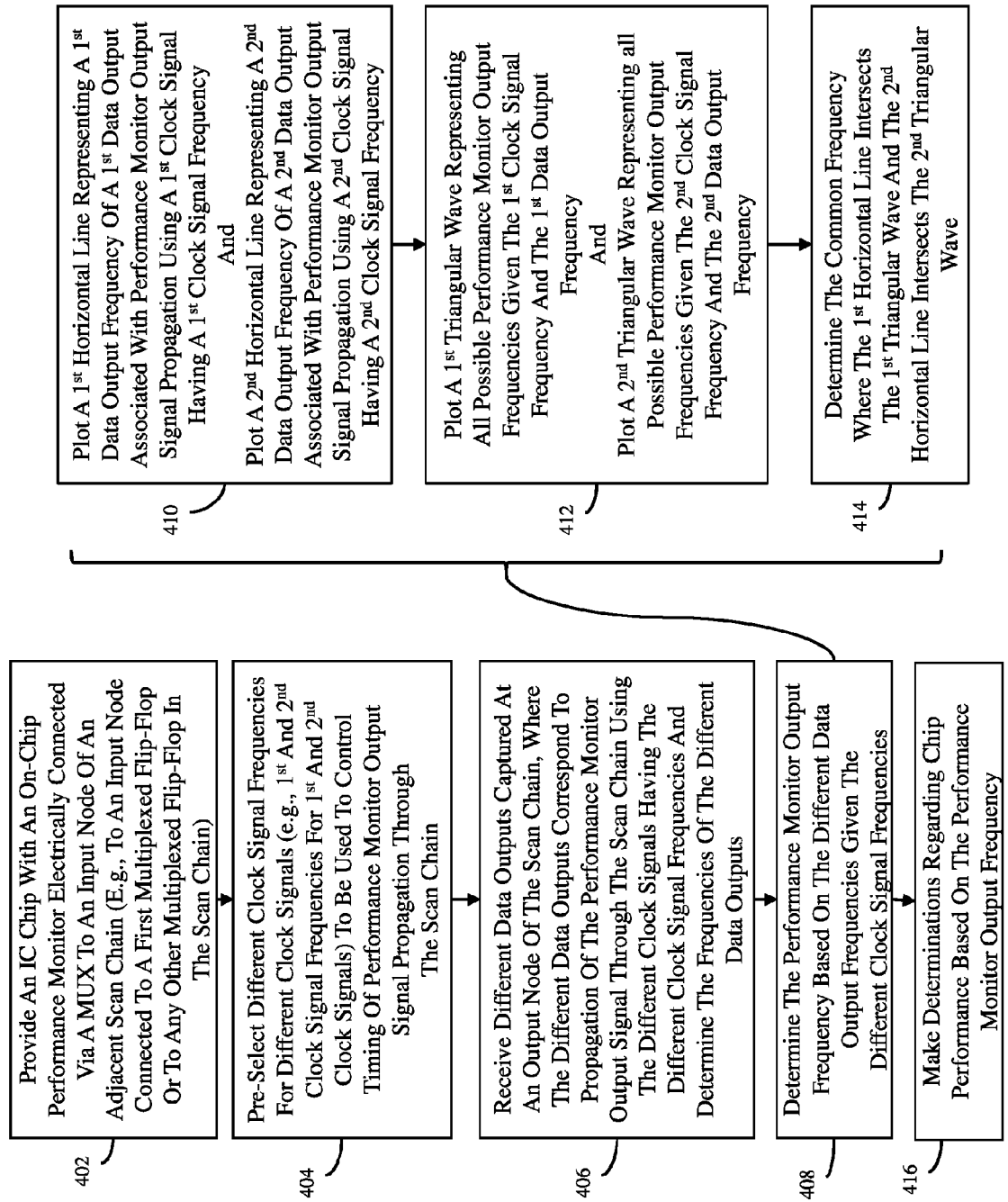
FIG. 4 is a flow diagram illustrating an embodiment of a chip performance monitoring method.

Referring to the flow diagram of FIG. 4, also disclosed herein are embodiments of a chip performance monitoring method.

The method can comprise providing an integrated circuit chip 101, such as that described in detail above, which comprises a performance monitor 110 (e.g., a performance screen ring oscillator (PSRO) that is electrically connected to an adjacent scan chain 150 through a multiplexer 130A, as shown in FIG. 1, or a multiplexer 130B, as shown in FIG. 2 (402). Specifically, referring to FIGS. 1 and 2 in combination with FIG. 4, the integrated circuit chip 101 can comprise functional combinational logic 140 that incorporates one or more scan chains 150. Each scan chain 150 can comprise a plurality of multiplexed flip-flops 155a-155d (also referred to herein as one-bit register elements) connected in series. The performance monitor 110 can output a performance monitor output signal 115 having a performance monitor output signal frequency. As discussed in detail above with regard to the system embodiments, a multiplexer (e.g., the multiplexer 130A of FIG. 1 or the multiplexer 130B of FIG. 2) can selectively apply the performance monitor output signal 115 to an input node 151 in the scan chain 150 and, thereby to an input D2 of one of multiplexed flip-flops in the scan chain 150, when in the performance monitor test mode (e.g., when the performance monitor select signal 135 and the test select signal 136 are both high). The scan chain 150 can receive the performance monitor output signal 115 at the input node 151 and can propagate the performance monitor output signal 115 through at least one of the multiplexed flip-flops in the scan chain 150 in order to avoid signal degradation incident to across-chip transmission of high frequency signals.

However, as mentioned above, timing of signal propagation through multiplexed flip-flops in the scan chain 150 will typically be controlled by a clock signal 175 with a frequency that is less than twice the frequency of the performance monitor output signal 115 at issue. Thus, the technique of propagating the performance monitor output signal 115 through one or all of the multiplexed flip-flops 155a-d in a scan chain 150 violates the Nyquist criterion, is referred to as sub-sampling and aliasing occurs such that the relationship between the performance monitor output signal frequency and the data output frequency is not linear. Instead there is a triangular relationship between the performance monitor output signal frequency of the performance monitor output signal 115 applied to the input node 151, the data output frequency of the data output at the output node 152 and the clock signal frequency (i.e., the sampling frequency) used to control signal propagation between the input node 151 and output node 152, thereby making determination of the performance monitor output frequency difficult. In order to account for this triangular relationship and compensate for any aliasing, timing of signal propagation through the scan chain can be controlled, during different time periods, using different clock signals having different clock signal frequencies (i.e., different sampling frequencies).

In this case, the method can further comprise receiving, by a processor 160 (e.g., an on-chip processor or an off-chip processor), different data outputs captured at an output node 152 of the scan chain 150 during the different time periods and determining the frequencies of the different data outputs (406). The method can then comprise determining, by the processor 160, the performance monitor output signal frequency based on the different data output frequencies given the different clock signal frequencies (i.e., given the frequencies of the different clock signals used to control the timing of signal propagation through the scan chain 150 and, thereby resulting in the different data outputs with the different data output frequencies at the output node 152) (408).

Specifically, at process 408, the performance monitor output signal frequency can be determined using the triangular frequency expression (1), which as mentioned above can be solved for as a piecewise function described by any of the additional frequency expressions: (2) or (3). In light of these frequency expressions (1)-(3) and referring to the graph of FIG. 2 in combination with FIG. 1, in one embodiment, the following graph plotting and analysis steps can be performed at process 408 in order to determine the performance monitor output signal frequency based on different clock signal frequencies of different clock signals and corresponding different data output frequencies (i.e., the sampled output frequencies) used when propagating the performance monitor output signal 115 through the scan chain 150. A first horizontal line 301 and a second horizontal line 302 can be plotted on the frequency graph of FIG. 3 (410). The first horizontal line 301 can represent a first data output frequency of a first data output captured at the output node 152 during a first time period and associated with sub-sampling using a first clock signal having a first clock frequency, which is assumed to be less than twice the performance monitor output signal frequency. Similarly, the second horizontal line 302 can represent a second data output frequency of a second data output captured at the scan chain output node 152 during a second time period and associated with sub-sampling using a second clock signal having a second clock signal frequency, which is also assumed to be less than twice the performance monitor output signal frequency. Additionally, a first triangular wave 311 and a second triangular wave 312 can be plotted on the graph 300. The expressions (2) and (3) described above can be used to graph the different angled segments of these triangular waves 311 and 312 such that the first triangular wave 311 represents all first possible performance monitor output signal frequency values given the first clock signal frequency and the first data output frequency and such that the second triangular wave 312 represents all second possible performance monitor output signal frequency values given the second clock signal frequency and the second data output frequency (412). This graph 300 and, particularly, the horizontal data output frequency lines 301 and 302 and the possible performance monitor output frequency waves 311 and 312 can then be analyzed to identify a common frequency (as indicated by the vertical line 320) where the first triangular wave 311 intersects the first horizontal line 301 and the second triangular wave 312 intersects the second horizontal line 302 (414). This common frequency will be the performance monitor output signal frequency, as long as the common frequency is not zero.

In addition to the above-described method steps, this embodiment can further comprise pre-selecting the different clock signal frequencies of the different clock signals (i.e., the first and second clock signal frequencies of the first and the second clock signals, respectively) that will be used to control timing of performance monitor output signal propagation through the scan chain 150 during the performance monitor test mode (404). Specifically, pre-selection of the different clock signal frequencies can be performed at process 404 so as to ensure that a pattern created by overlaying the first horizontal line 301, the second horizontal line 302, the first triangular wave 311 and the second triangular wave 312 within the graph 300 created at processes 410-412 and illustrated in FIG. 3 is non-repeating within a given range 350 of all possible performance monitor output signals and, thereby to ensure that only one common frequency is identified at process 412 as the performance monitor output signal frequency. As long as the two different clock signal frequencies (i.e., the two different sampling frequencies) are preselected at process 404 such that they are sufficiently close to each other, it can be assured that triangular waves 311 and 312 are not repeating over the frequency range 350 of interest for the performance monitor so that only one possible answer frequency (i.e., one possible common frequency 320) is found. Additionally, pre-selection of the different clock signal frequencies (i.e., the first clock signal frequency and the second clock signal frequency) at process 404 can further be performed such that the first data output frequency (as represented by the first horizontal line 301) and the second data output frequency (as represented by the second horizontal line 302) will fall between and, more particularly, at least some minimum frequency difference 365 from the high and low peaks 361-362 of the first triangular wave 311 and the second triangular wave 312, as shown in FIG. 3, in order to ensure that the first and second horizontal lines 301 and 302 representing the first and second data output frequencies, respectively, do not fall on the outer boundaries of the possible performance monitor output signal frequencies where frequency jitter can cause inaccurate results.

It should be understood that, alternatively, any other suitable technique can be used at process 408 to determine the performance monitor output signal frequency following propagation of the performance monitor output signal through a scan chain 150 or portion thereof, as discussed above.

Once the performance monitor output signal frequency (e.g., the PSRO frequency) has been determined at process 408, determinations can be made regarding the chip performance based on this output signal frequency (416). For example, the speed of the circuit under test can be determined based on that output signal frequency and, given this speed, a determination can be made as to whether the circuit under test meets performance specifications. Additionally, by comparing performance monitor output signal frequencies (e.g., PSRO output signal frequencies) from multiple PSROs, across-chip process variations can be identified. Techniques for determining whether a circuit under test meets performance specifications based on a performance monitor output signal frequency and/or identifying across-chip process variations based on a comparison of multiple performance monitor output signal frequencies are well known in the art and, thus, the details of such techniques are omitted from this specification in order to allow the reader to focus on the salient aspects of the disclosed embodiments.

Also disclosed herein are embodiments of a computer program product. The computer program product can comprise a tangible computer readable storage device. The tangible computer readable storage device can store program code, which is executable by a computer to perform the above-described chip performance monitoring method.

More particularly, as will be appreciated by one skilled in the art, aspects of the disclosed embodiments may be implemented as a method, a system or a program storage device (i.e., a computer program product). Accordingly, aspects of the disclosed embodiments may be implemented entirely in hardware, entirely in software (including firmware, resident software, micro-code, etc.) or in a combination of software and hardware and may generally be referred to herein as a "circuit," "module" or "system." Furthermore, aspects of the disclosed embodiments may take the form of a program storage device (i.e., a computer program product) embodied in one or more computer readable medium(s) having computer readable program code embodied thereon.

Any combination of one or more computer readable medium(s) may be utilized. The computer readable medium may be a tangible (i.e., non-transitory) computer readable storage medium or a computer readable signal medium. A tangible computer readable storage medium may be, for example, but is not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device. A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the disclosed embodiments may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the disclosed embodiments are described below with reference to flowchart illustrations and/or block diagrams of methods, apparatus (systems) and computer program products. It will be understood that each block of the flowchart illustrations and/or D-2 block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 5:
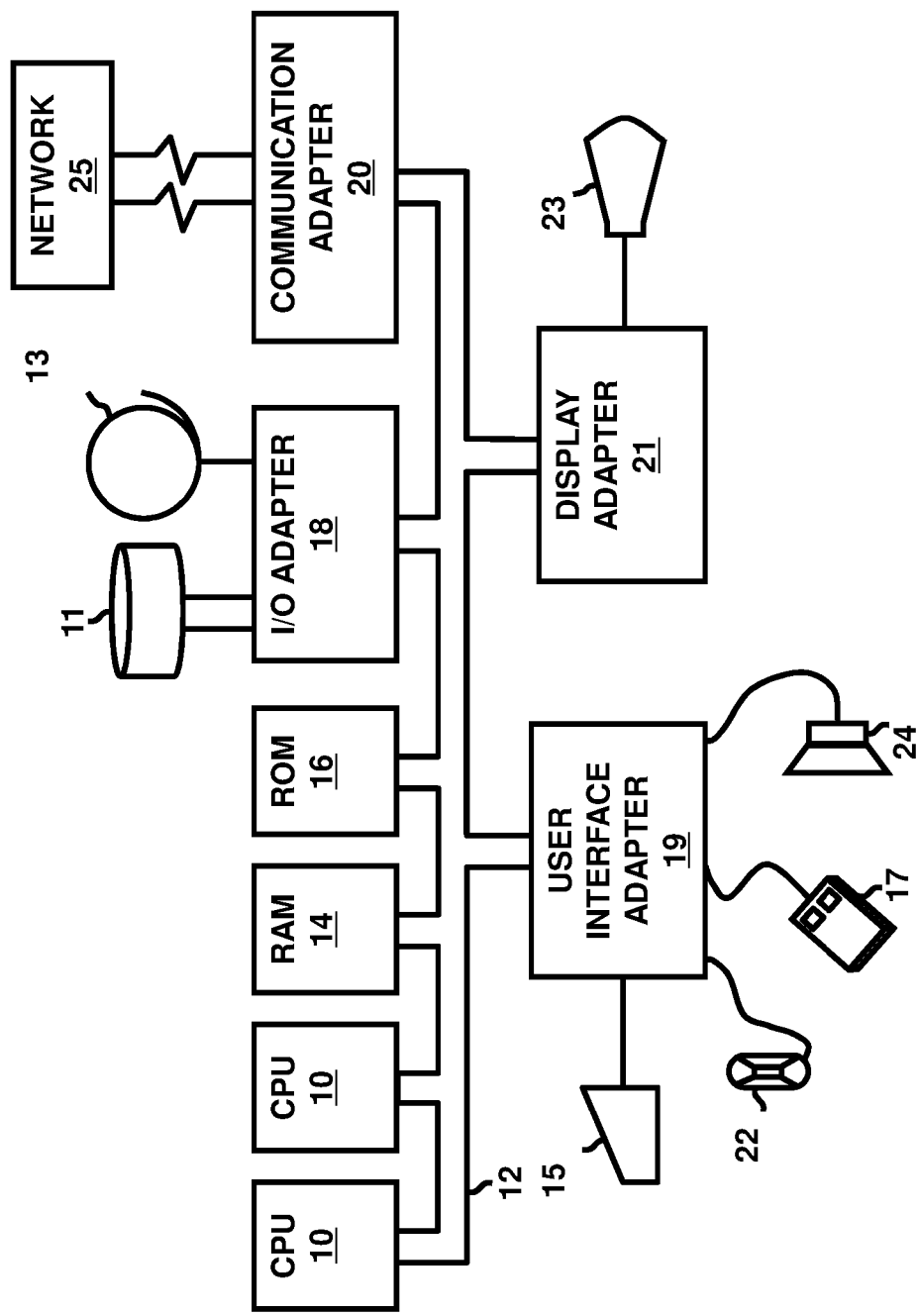
FIG. 5 is a schematic diagram illustrating an exemplary hardware environment for implementing the disclosed system, method and computer program product embodiments.

A representative hardware environment for implementing the system, method and computer program product embodiments disclosed herein is depicted in FIG. 5. This schematic drawing illustrates a hardware configuration of an information handling/computer. The system comprises at least one processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the disclosed method embodiments. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

It should be understood that the terminology used herein is for the purpose of describing particular embodiments only and is not intended to be limiting. As used herein, the singular forms "a", "an" and "the" are intended to include the plural forms as well, unless the context clearly indicates otherwise. It should further be understood that the terms "comprises" "comprising", "includes" and/or "including", as used in this specification, specify the presence of stated features, integers, steps, operations, elements, and/or components, but do not preclude the presence or addition of one or more other features, integers, steps, operations, elements, components, and/or groups thereof. Additionally, it should be understood that the corresponding structures, materials, acts, and equivalents of all means or step plus function elements in the claims below are intended to include any structure, material, or act for performing the function in combination with other claimed elements as specifically claimed. The above-description has been presented for purposes of illustration, but is not intended to be exhaustive or limiting. Many modifications and variations will be apparent to those of ordinary skill in the art without departing from the scope and spirit of the disclosed embodiments.

Therefore, disclosed above are embodiments of a chip performance monitoring system, a chip performance monitoring method and a computer program product, wherein a high frequency performance monitor output signal from an on-chip performance monitor is propagated through an adjacent scan chain, which is otherwise used for scan chain testing of combinational logic, to avoid signal degradation incident to across-chip transmission of high frequency signals. In these embodiments, since the clock signal frequency used to control signal propagation through the scan chain will typically be less than twice the performance monitor output signal frequency, frequency sub-sampling with aliasing occurs. To compensate, signal propagation through the scan chain can be controlled during different time periods using different clock signals having different clock signal frequencies and, during these different time periods, different data outputs can be captured at an output node of the scan chain. The data output frequencies of these different data outputs can be measured and the performance monitor output signal frequency can be determined based on the different data output frequencies given the different clock signal frequencies (i.e., given the frequencies of the different clock signals used to control the timing of signal propagation through the scan chain and, thereby resulting in the different data outputs with the different data output frequencies).

What is claimed is:

1. A chip performance monitoring method comprising:
    receiving, by a processor, different data outputs captured at an output node of a scan chain on an integrated circuit chip at different time periods during propagation of a performance monitor output signal through said scan chain from an input node and to said output node, said different time periods corresponding to when timing of said propagation is controlled by different clock signals having different clock signal frequencies;
    determining, by said processor, different data output frequencies of said different data outputs; and
    determining, by said processor, a performance monitor output signal frequency of said performance monitor output signal based on said different data output frequencies given said different clock signal frequencies.

2. The chip performance monitoring method of claim 1, said different clock signals comprising at least two different clock signals with at least two different clock signal frequencies, respectively.

3. The chip performance monitoring method of claim 1, said determining of said performance monitor output signal frequency based on said different clock signal frequencies and said different data output frequencies comprising:
    plotting, on a graph, a first horizontal line and a second horizontal line, said first horizontal line representing a first data output frequency of a first data output captured at said output node during a first time period and associated with a first clock signal having a first clock signal frequency and said second horizontal line representing a second data output frequency of a second data output captured at said output node during a second time period and associated with a second clock signal having a second clock signal frequency;
    plotting, on said graph, a first triangular wave and a second triangular wave, said first triangular wave representing first possible performance monitor output signal frequency values given said first clock signal frequency and said first data output frequency and said second triangular wave representing second possible performance monitor output signal frequency values given said second clock signal frequency and said second data output frequency; and
    analyzing said graph to identify said performance monitor output signal frequency as a common frequency where said first triangular wave intersects said first horizontal line and said second triangular wave intersects said second horizontal line.

4. The chip performance monitoring method of claim 3, said method further comprising pre-selecting said first clock signal frequency and said second clock signal frequency so that a pattern created by said first horizontal line, said second horizontal line, said first triangular wave and said second triangular wave is non-repeating within a given range of possible performance monitor output signals so as to ensure that only one common frequency is identified as said performance monitor output signal frequency.

5. The chip performance monitoring method of claim 4, said pre-selecting further being performed so that said first data output frequency and said second data output frequency are between high and low peaks of both said first triangular wave and said second triangular wave.

6. The chip performance monitoring method of claim 1, said performance monitor output being produced by a ring oscillator.

7. The chip performance monitoring method of claim 1, said scan chain comprising a plurality of multiplexed flip-flops connected in series, said input node being connected to a first multiplexed flip-flop in said scan chain, and said multiplexed flip-flops selectively applying one of said performance monitor output signal and scan data from a test pattern generator to said input node.

8. The chip performance monitoring method of claim 1, said scan chain comprising a plurality of multiplexed flip-flops connected in series, said input node being connected to one of an intermediate multiplexed flip-flop and a last flip-flop in said scan chain and said multiplexer selectively applying one of said performance monitor output signal and scan data from an immediately preceding multiplexed flip-flop in said scan chain to said input node.

9. The chip performance monitoring method of claim 1, said scan chain comprising a plurality of multiplexed flip-flops connected in series and said output node being connected to any one of an intermediate multiplexed flip-flop in said scan chain downstream of said input node and a last multiplexed flip-flop in said scan chain.

10. A non-transitory computer program product comprising a non-transitory computer readable storage device, said non-transitory computer readable storage device storing program code, said program code being executable by a computer to perform a chip performance monitoring method, said chip performance monitoring method comprising:
receiving different data outputs captured at an output node of a scan chain on an integrated circuit chip at different time periods during propagation of a performance monitor output signal through said scan chain from an input node to said output node, said different time periods corresponding to when timing of said propagation is controlled by different clock signals having different clock signal frequencies;
determining different data output frequencies of said different data outputs; and
determining a performance monitor output signal frequency of said performance monitor output signal based on said different data output frequencies given said different clock signal frequencies.

11. The computer program product of claim 10, said different clock signals comprising at least two different clock signals with at least two different clock signal frequencies, respectively.

12. The computer program product of claim 10, said determining of said performance monitor output signal frequency based on said different clock signal frequencies and said different data output frequencies comprising:
plotting, on a graph, a first horizontal line and a second horizontal line, said first horizontal line representing a first data output frequency of a first data output captured at said output node during a first time period and associated with a first clock signal having a first clock signal frequency and said second horizontal line representing a second data output frequency of a second data output captured at said output node during a second time period and associated with a second clock signal having a second clock signal frequency;
plotting, on said graph, a first triangular wave and a second triangular wave, said first triangular wave representing first possible performance monitor output signal frequency values given said first clock signal frequency and said first data output frequency and said second triangular wave representing second possible performance monitor output signal frequency values given said second clock signal frequency and said second data output frequency; and
analyzing said graph to identify said performance monitor output signal frequency as a common frequency where said first triangular wave intersects said first horizontal line and said second triangular wave intersects said second horizontal line.

13. The computer program product of claim 12, said method further comprising pre-selecting said first clock signal frequency and said second clock signal frequency so that a pattern created by said first horizontal line, said second horizontal line, said first triangular wave and said second triangular wave is non-repeating within a given range of possible performance monitor output signals so as to ensure that only one common frequency is identified as said performance monitor output signal frequency.

14. A chip performance monitoring method comprising:
outputting a performance monitor output signal having a performance monitor output signal frequency using a performance monitor on an integrated circuit chip;
supplying said performance monitor output signal to an input node of a scan chain on said chip, said input node being electrically connected to said performance monitor;
propagating said performance monitor output signal using said scan chain;
generating, using a variable clock signal generator on said chip, different clock signals having different clock signal frequencies for controlling signal propagation timing through said scan chain within different time periods such that, during said different time periods, different data outputs with different data output frequencies are output at an output node of said scan chain, said different clock signal frequencies each being less than twice said performance monitor output signal frequency; and
measuring said different data output frequencies of said different data outputs at said output node during said different time periods and determining said performance monitor output signal frequency based on said different data output frequencies given said different clock signal frequencies using a processor electrically connected to said output node.

15. The chip performance monitoring method of claim 14, said different clock signals comprising at least two different clock signals with at least two different clock signal frequencies, respectively.

16. The chip performance monitoring method of claim 14, said processor comprising any one of an on-chip processor electrically connected directly to said output node and an off-chip processor electrically connected to said output node through an output pin.

17. The chip performance monitoring method of claim 14, said performance monitor comprising a ring oscillator.

18. The chip performance monitoring method of claim 14, said scan chain comprising a plurality of multiplexed flip-flops connected in series, said input node being connected to a first multiplexed flip-flop in said scan chain, and said method further comprising selectively applying one of said performance monitor output signal and scan data from a test pattern generator to said input node, using said multiplexed flip-flops.

19. The chip performance monitoring method of claim 14, said scan chain comprising a plurality of multiplexed flip-flops connected in series, said input node being connected to one of an intermediate multiplexed flip-flop and a last flip-flop in said scan chain and said method further comprising selectively applying one of said performance monitor output signal and scan data from an immediately preceding multiplexed flip-flop in said scan chain to said input node, using said multiplexer.

20. The chip performance monitoring method of claim 14, said scan chain comprising a plurality of multiplexed flip-flops connected in series and said output node being connected to any one of an intermediate multiplexed flip-flop in said scan chain downstream of said input node and a last multiplexed flip-flop in said scan chain.

\* \* \* \* \*